United States Patent
Zhang et al.

(10) Patent No.: US 9,461,172 B2
(45) Date of Patent: Oct. 4, 2016

(54) METHOD FOR FABRICATING SEMICONDUCTOR DEVICE

(71) Applicant: Semiconductor Manufacturing International (Shanghai) Corporation, Shanghai (CN)

(72) Inventors: Haiyang Zhang, Shanghai (CN); Jia Ren, Shanghai (CN)

(73) Assignee: SEMICONDUCTOR MANUFACTURING INTERNATIONAL CORPORATION, Shanghai (CN)

( * ) Notice: Subject to any disclaimer, the term of this patent is extended or adjusted under 35 U.S.C. 154(b) by 0 days.

(21) Appl. No.: 14/520,299

(22) Filed: Oct. 21, 2014

(65) Prior Publication Data

US 2015/0187908 A1   Jul. 2, 2015

(30) Foreign Application Priority Data

Dec. 30, 2013   (CN) .......................... 2013 1 0745807

(51) Int. Cl.
*H01L 29/66* (2006.01)
*H01L 29/78* (2006.01)
*H01L 21/3065* (2006.01)

(52) U.S. Cl.
CPC ....... *H01L 29/7848* (2013.01); *H01L 21/3065* (2013.01); *H01L 29/66636* (2013.01)

(58) Field of Classification Search
CPC ............... H01L 21/02529; H01L 21/02532; H01L 21/3065; H01L 29/66477; H01L 29/7848
See application file for complete search history.

(56) References Cited

U.S. PATENT DOCUMENTS

| | | | | |
|---|---|---|---|---|
| 8,367,528 B2* | 2/2013 | Bauer | ............... | H01L 21/02381 257/E21.131 |
| 9,000,522 B2* | 4/2015 | Cheng | ............... | H01L 21/76283 257/347 |
| 2006/0088968 A1* | 4/2006 | Shin | ..................... | H01L 29/6656 438/299 |
| 2008/0079033 A1* | 4/2008 | Waite | .............. | H01L 21/823807 257/255 |
| 2009/0108306 A1* | 4/2009 | Cheng | ............... | H01L 21/32115 257/288 |
| 2009/0246921 A1* | 10/2009 | Cheng | ............. | H01L 21/823807 438/221 |
| 2010/0035419 A1* | 2/2010 | Dube | ................. | H01L 21/02381 438/494 |
| 2011/0104875 A1* | 5/2011 | Wojtczak | .......... | H01L 21/30608 438/478 |
| 2011/0210393 A1* | 9/2011 | Chen | ............... | H01L 21/823431 257/347 |
| 2012/0129354 A1* | 5/2012 | Luong | ................. | H01L 21/6831 438/714 |
| 2012/0292707 A1* | 11/2012 | Toh | ......................... | B82Y 10/00 257/365 |
| 2013/0320429 A1* | 12/2013 | Thomas | ............. | H01L 29/66712 257/329 |

\* cited by examiner

*Primary Examiner* — Matthew W Such
*Assistant Examiner* — Stephen C Smith
(74) *Attorney, Agent, or Firm* — Anova Law Group, PLLC

(57) ABSTRACT

Methods for fabricating semiconductor devices are provided. Gate structures are formed on a top surface of a substrate to form semiconductor devices. Trenches are formed in the substrate on both sides of each gate structure of each semiconductor device. The trenches on the both sides of each gate structure are filled with stress layers, the stress layers in the substrate protruding over the top surface of the substrate. The stress layers are ion-doped and annealed on the both sides of each gate structure, and are pulse-etched to form a source region and a drain region of each gate structure. The pulse-etching is controlled such that the source regions and the drain regions of the plurality of semiconductor devices have a top surface coplanar with the top surface of the substrate.

20 Claims, 4 Drawing Sheets

METHOD FOR FABRICATING SEMICONDUCTOR DEVICE

CROSS-REFERENCES TO RELATED APPLICATIONS

This application claims priority to Chinese Patent Application No. CN201310745807.3, filed on Dec. 30, 2013, the entire content of which is incorporated herein by reference.

FIELD OF THE DISCLOSURE

The present disclosure relates to the field of semiconductor manufacturing technology and, more particularly, relates to semiconductor devices and fabrication methods.

BACKGROUND

When forming a CMOS device, a gate structure is often formed on a substrate, followed by forming trenches in the substrate on both sides of the gate structure. Stress layers are formed in the trenches and then are doped to form source/drain regions. However, overfill may occur to the stress layers to have a top surface protruding above a top surface of the substrate.

Such overfill of the stress layers may generate uneven surface of the substrate and thus impede subsequent manufacturing processes. In addition, overfill of the stress layers may affect stress distribution in the stress layers, e.g., may weaken or remove desired stress to be generated in the stress layers. Device performance of the resultant CMOS devices may be adversely affected.

Conventional solutions to solve the overfill problems include use of an etch process to remove overfill portion of the stress layers above the top surface of the substrate. However, a single wafer may include a large amount of CMOS devices with different sizes. Accordingly, distances or pitches between trenches in such different CMOS devices are also different. The overfill portions may have different heights over corresponding stress layers for trenches having different sizes. Consequently, it is difficult to control the etch process of the overfill portions with different heights for various different CMOS devices on a same wafer.

When etching the overfill portions with different heights on a same wafer, the stress layers after etching may still have different heights over the substrate surface for the various CMOS devices on the same wafer. For example, some stress layers of some CMOS devices may be etched to reach a desired height, e.g., to be substantially flat with the substrate surface, while other stress layers of other CMOS devices in the same wafer may be etched still having a height over/below the substrate surface due to unsufficient/over etching.

Therefore, it is desirable to control an etching process of stress layers on a wafer, such that overfilling portions of stress layers can be removed and, after etching, all stress layers in a same wafer can be substantially flush with the substrate surface.

BRIEF SUMMARY OF THE DISCLOSURE

According to various embodiments, there is provided a method for forming a semiconductor device. Gate structures are formed on a top surface of a substrate to form semiconductor devices. Trenches are formed in the substrate on both sides of each gate structure of each semiconductor device. The trenches on the both sides of each gate structure are filled with stress layers, the stress layers in the substrate protruding over the top surface of the substrate. The stress layers are ion-doped and annealed on the both sides of each gate structure, and are pulse-etched to form a source region and a drain region on the both sides of each gate structure. The pulse-etching is controlled such that the source regions and the drain regions of the plurality of semiconductor devices have a top surface coplanar with the top surface of the substrate.

According to various embodiments, there is also provided a method for forming a semiconductor device. Gate structures are formed on a top surface of a substrate to form semiconductor devices. Trenches are formed in the substrate on both sides of each gate structure of each semiconductor device. The trenches on the both sides of each gate structure are filled with stress layers, the stress layers in the substrate protruding over the top surface of the substrate. The stress layers are pulse-etched to remove protruded portions, such that the pulse-etched stress layers have a top surface coplanar with the top surface of the substrate. The pulse-etched stress layers are ion-implanted and annealed to form a source region and a drain region on the both sides of each gate structure. The source regions and the drain regions of the plurality of semiconductor devices on the same substrate have a top surface coplanar with the top surface of the substrate.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

In a manufacturing process of a semiconductor device, source/drain regions can be formed by filling trenches in a substrate, which may generate overfills above a top surface of the substrate. As a result, source/drain regions in a same and/or different semiconductor device of a wafer may have different protruded heights over the substrate.

For forming CMOS devices, after forming source/drain regions, protruded portions of source/drain regions over the substrate can be removed by an etching process. However, due to various different sizes/pitches of trenches formed for CMOS devices on a same wafer, stress layers formed in these trenches can correspondingly have various etching areas with different sizes or pitches. Such differences can cause various different etching rates of the protruded portions of the stress layers in the same wafer. In other words, it is hard to control the etching amount of each stress layer of the same wafer.

The disclosed methods of forming a semiconductor device includes use of an etching machine to generate a pulse output power to etch stress layers of semiconductor devices in an intermittent manner to perform a plasma etching such that the pulse-etched stress layers in each semiconductor device of the wafer can have a top surface coplanar with the substrate.

After forming the stress layers, a pulse-etching process can be performed to the stress layers to remove protruded portion of the stress layer over a top surface of a substrate of the semiconductor device. The pulse-etching process can be controlled to adjust the etching amount of stress layers having different sizes in a same wafer to allow the stress layers having different protruded heights to be etched with different etching amount, such that all of the etched stress layers in the same wafer can have a top surface coplanar with the top surface of the substrate.

Figure 2A:
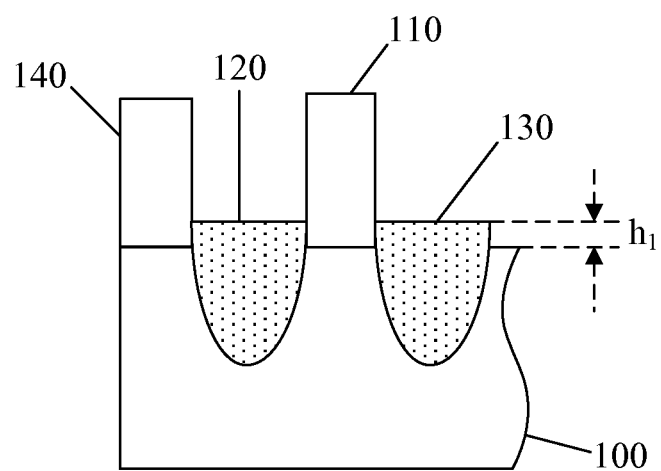
FIGS. 2a-2b and 3a-3b depict cross-sectional views of an exemplary semiconductor device at certain stages during formation in accordance with various disclosed embodiments.
Figure 2B:
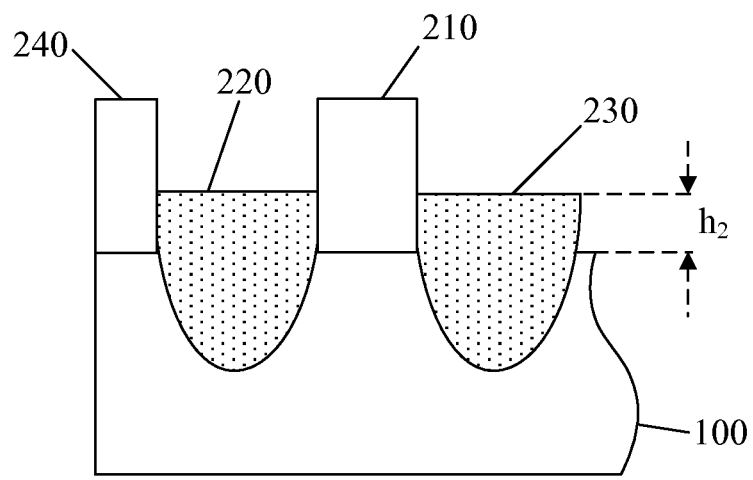

FIGS. 2a-2b depict CMOS devices formed in different locations of a same substrate/wafer consistent with various disclosed embodiments. As shown in FIGS. 2a-2b, substrate 100 is provided (e.g., Step S11). In one embodiment, substrate 100 is a silicon substrate.

Multiple gate structures can be formed on the substrate 100. The gate structures can include, for example, gate structures 110 and 140 in FIG. 2a and gate structures 210 and 240 in FIG. 2b.

Gate structures 110, 140, 210, and 240 can have different sizes to form various CMOS devices with different sizes. Distance between the gate structures 110 and 140 and distance between gate structures 210 and 240 can be used to define sizes of trenches to be subsequently formed in the substrate 100.

In various embodiments, gate structures 110, 140, 210, and 240 can include any suitable gate structures formed by any suitable methods. For example, each gate structure can be formed to include a gate electrode (e.g., made of polysilicon (poly-Si) or a metal material), a gate dielectric layer under the gate electrode, and a sidewall spacer formed on sidewalls of the gate electrode and the gate dielectric layer.

Trenches (not illustrated in FIGS. 2a-2b) can be formed in the substrate 100 on both sides of each of gate structures 110 and 210 (e.g., Step S12). Stress layers (and source/drain regions) can be subsequently formed in the trenches. For example, sizes and/or pitches of the trenches can be controlled to respectively define sizes/pitches of subsequently formed source/drain regions. Because the previously-formed gate structure 110 and gate structure 210 have different sizes, sizes and pitches of trenches on both sides of gate structure 110 and gate structure 210 can be different accordingly.

In one embodiment, the semiconductor device is an N-type transistor, and the trench is U-shaped. The U-shaped trench can be filled with silicon carbide (SiC) material to form a stress layer. The SiC stress layer can provide a tensile stress in a channel region of the N-type transistor.

In another embodiment, the semiconductor device is a P-type transistor, and the trench is Σ-shaped. The Σ-shaped trench can be filled with silicon germanium (SiGe) material to form a stress layer. The SiGe stress layer can provide compressive stress in a channel region of the P-type transistor.

In various embodiments, the stress layers can be formed by an epitaxial growth process in corresponding trenches.

Still in FIGS. 2a-2b, stress layers are formed in the trenches to form source/drain regions (e.g. Step S13). Stress layers are often formed protruding from top surface of the substrate 100 due to overfill of the stress layer material. Such overfill may be generated by epitaxial growth of materials in the trenches. As dimensions (or sizes) of semiconductor devices, trench sizes, and/or trench pitches increasingly shrink, epitaxial growth of materials in the trenches is difficult to control.

In addition, due to differences in trench size and/or trench pitch, epitaxial growth thereof may have various different growth rates. Stress layers formed in trenches having different trench sizes, and/or trench pitches can have different levels of overfill.

For example, stress layers 120, 130 in FIG. 2a can protrude over a top surface of substrate 100 by a height of h1, while stress layers 220, 230 in FIG. 2b can protrude over a top surface of substrate 100 by a height of h2. For illustration purposes, height h1 in FIG. 2a is less than height h2 in FIG. 2b, although heights h1 and h2 can be any heights of the stress layers formed in the substrate 100. In some cases, height h1 can be equal to or greater than height h2.

Stress layers in FIGS. 2a and 2b can be ion doped to form source/drain regions 120/130 and source/drain regions 220/230 (e.g., Step S14), e.g. by an ion-implantation. Any suitable methods for forming source/drain regions can be encompassed in the present disclosure. The ion-doped source/drain regions 120/130 and source/drain regions 220/230 can then be annealed. (e.g., Step S15)

The annealing step can be used to activate the doped ions in source/drain regions 120/130 and 220/230, and can also allow stress to be generated on a channel region between the source/drain regions and under a corresponding gate structure. In one embodiment, the substrate 100 is a silicon substrate. As disclosed above, in one embodiment, a stress layer of silicon carbide can be formed in the U-shaped trench. After annealing, the stress layer can provide tensile stress to the channel region, e.g. between source/drain regions 120/130.

In various embodiments, the ion-doped stress layers can be simultaneously annealed and pulse-etched to form the source region(s) and the drain region(s) having a coplanar top surface with the substrate.

Figure 3A:
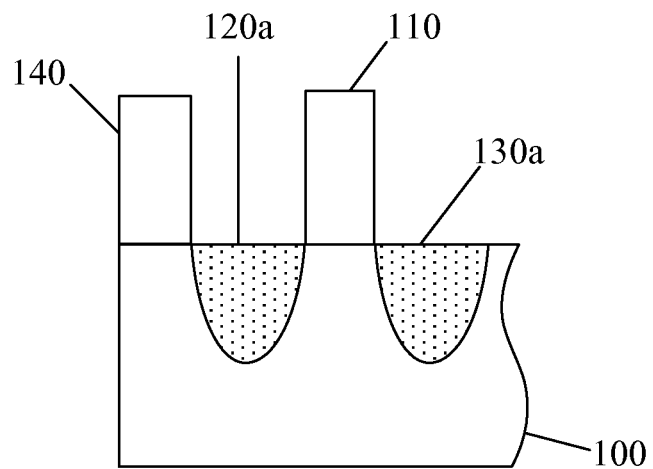
Figure 3B:
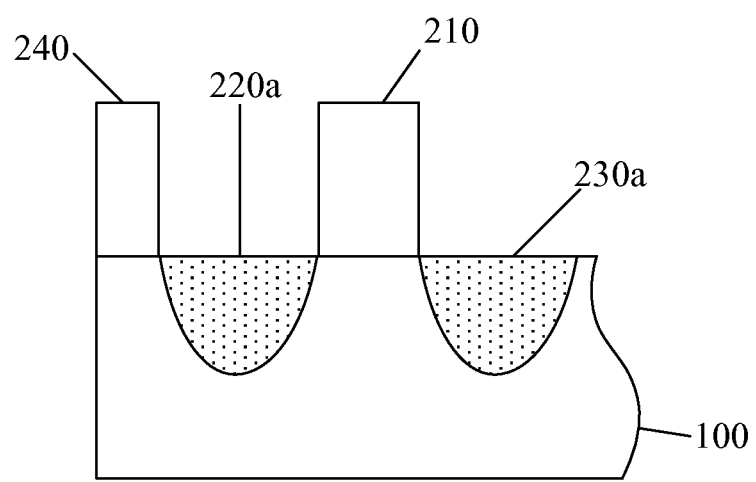

Referring to FIGS. 3a-3b, a pulse-etching process can be performed to source/drain regions 120/100 having height h1 over the substrate 100, and to source/drain regions 220/230 having height h2 over the substrate 100 (e.g., Step S16). The resultant source/drain regions 120a/130a and 220a/230a can have a top surface coplanar with the top surface of the substrate 100.

As used herein, the process of "pulse-etching" may include use of a pulse output power from an etching machine. During the pulse-etching process, intermittent etching can be performed by an etching cycle to alternate an etching mode (e.g., etching for a certain period of etching time) and a standby mode (e.g., stopping etching for a certain period of standby time). Such etching cycle can be repeated for a certain number of times. During the repeated etching cycle, the etching time and standby time can be individually controlled according to specific applications.

Figure 4:
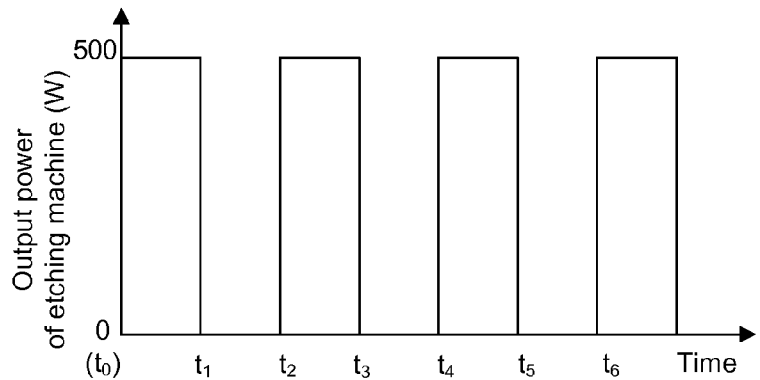
FIG. 4 depicts an exemplary power output for a pulse-etching in accordance with various disclosed embodiments.

FIG. 4 depicts an example of pulse output power generated by an etching machine versus time in accordance with various disclosed embodiments. As shown in FIG. 4, the etching machine can output power in a pulse mode. That is, the etching machine can excite etching gas(es) in an intermittent, non-continuous manner to etch the protruded portion of the source/drain regions 120/130 and source/drain regions 220/230 above the substrate 100.

In one embodiment, the etching machine can have a peak output power of about 500 watts. For example, the etching machine can output a power of 500 watts at time $t_0$ to start an etching mode. At time the output power of the etching machine can be reduced to 0 to start a standby mode. At time $t_2$, the etching machine can output a power at the peak output power of about 500 watts to start another etching mode. As such, a pulse cycle or an etching cycle from time $t_0$ to time $t_2$ can include one etching mode for a period of etching time ($t_0$-$t_1$) and one standby mode for a period of standby time ($t_1$-$t_2$).

Note that, for illustration purposes, although FIG. 4 shows that each etching time is substantially the same as one another, and each standby time is substantially the same as one another, the etching times and standby times in a pulse-etching process can be altered and modified as desired.

In this manner, the disclosed plasma pulse-etching process can allow the source/drain regions 120/130 and 220/230 to be coplanar with the top surface of the substrate 100 after etching, even when various different etching areas are included in a same wafer for the etching process. For example, the plasma etching process can provide desired coplanar structure even when some of the source/drain regions 120/130 have height $h_1$, some of source/drain regions 220/230 have height $h_2$, and some source/drain regions have height $h_1$ over the top surface of the substrate 100, and/or even for a source region and a drain region in a same semiconductor device having sizes/structures different from one another.

The size of etching areas may affect etching rate of the plasma pulse-etching. For example, during a plasma etching, etching gases may react with materials being etched to form a polymer which may block the etching process of the material to be etched. Such polymer may be in a gas phase and may aggregate together. The degree of polymer aggregation may be affected by the sizes of etching areas. The higher degree of polymer aggregation, the more material can be blocked from etching and the slower the etching rate of the material.

For example, distance between gates 110 and 140 in FIG. 2a is less than distance between gates 210 and 240 in FIG. 2b, trenches formed in FIG. 2a can thus have greater opening and the formed source/drain regions can have greater size. Areas that need to be etched in FIG. 2b can thus be greater than such areas in FIG. 2a. Because of the greater etching area in FIG. 2b, polymer formed from plasma etching can be easily dispersed to provide a low degree of polymer aggregation. Accordingly, the etching rate in FIG. 2b can be higher (faster), compared with the etching rate of source/drain regions in FIG. 2a. Note that the structures in FIGS. 2a-2b are from a same wafer.

In one embodiment, when the height h1 in FIG. 2a equals to (not illustrated) the height h2 in FIG. 2b, and distance between gate structures 110/140 is different than distance between gate structures 210/240, the formed source/drain 120/130 in FIG. 2a can have a size different from the formed source/drain 220/230 in FIG. 2b. Source/drain regions 120/130 can have a top surface area different from source/drain regions 220/230. In other words, etching areas for structures in FIGS. 2a-2b are different.

When the pulse output power is used and controlled by the etching machine to allow the pulse-etching process in an intermittent, non-continuous manner, the plasma etching process may be stopped after a certain period of etching time. At this point, the etching machine temporarily stops excitation of etching gas(s), such that the resultant polymer can have sufficient time to dissipate from the etched surface and to reduce the degree of polymer aggregation on the etched surface and to reduce obstruction of etching rate. A next pulse cycle (or etching mode) can then start. In this manner, etching rate at source/drain regions 120/130 and at source/drain regions 220/230 with different etching areas can be maintained to be substantially consistent with each other. After etching, source/drain regions 120a/130a and source/drain regions 220a/230a can be coplanar with the substrate 100 as shown in FIGS. 3a-3b.

In another embodiment, when the height h1 in FIG. 2a is less than the height h2 in FIG. 2b, by using the pulse-etching process, the etch rate at the source/drain regions 220/230 can be controlled to be higher than the source/drain regions 120/130 such that, after etching, the etched source/drain regions 120a/130a and the source/drain regions 220a/230a can be coplanar with the top surface of the substrate 100.

In an additional embodiment, when the height h1 in FIG. 2a is greater than the height h2 in FIG. 2b, by adjusting the pulse output power, duty cycle, etc. of the etching machine, etching rate of source/drain regions 120/130 and source/drain regions 220/230 can be controlled at different rates, such that the etched source/drain regions 120a/130a and the source/drain regions 220a/230a can be coplanar with the substrate 100.

In various embodiments, prior to the pulse-etching, an etch mask can be formed on the wafer to expose source/drain regions of semiconductor devices on the substrate to protect other portions of the semiconductor device from being pulse etched.

In certain embodiments, when source/drain regions are formed by silicon carbide material, the etching gas(es) can include chlorine trifluoride, hydrogen bromide, or chlorine. However, other suitable etching gases can also be used based on materials used to form the source/drain regions.

For example, when hydrogen bromide is used as an etching gas, the hydrogen bromide can have a flow rate of about 50 sccm to about 1000 sccm. Further, the etching gas can include oxygen and protective gas(es). For example, oxygen can have a flow rate of about 1 sccm to about 50 sccm. The protective gas can include helium gas and/or argon gas, having a helium gas flow rate of about 10 sccm to about 500 sccm and having an argon flow rate about 0 sccm to about 500 sccm.

Further, the plasma etching gas can have a pressure in a range of about 10 mTorr to about 200 mTorr. Source power or output power of the etching machine can be in the range of about 100 watts to about 2000 watts, a bias power can be in the range of 0 to about 500 watts, a pulse frequency of the output power can be in the range of about 100 Hz to about 10,000 Hz, and a duty cycle is in the range of about 90% to about 0%.

Figure 1:
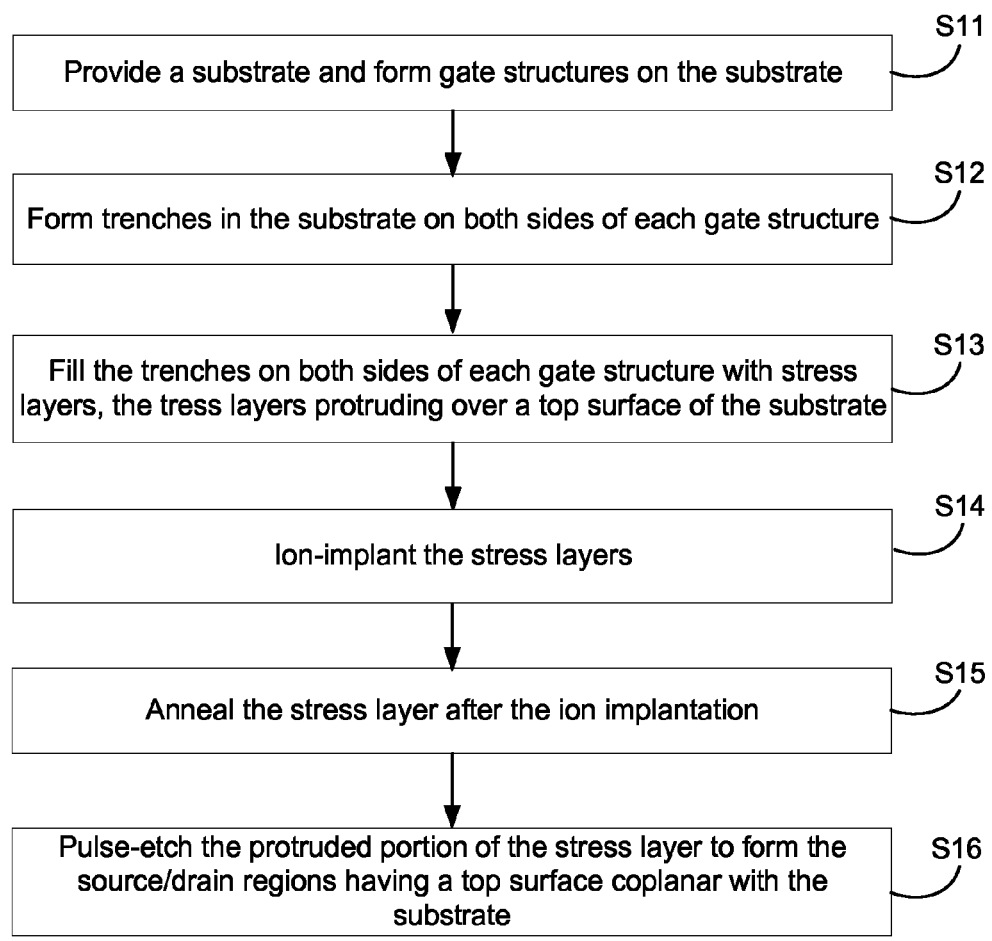
FIG. 1 depicts an exemplary method for forming a semiconductor device in accordance with various disclosed embodiments.

It should be noted that, the disclosed method can be performed in a certain order as discussed above or in any order as desired. In one embodiment, as depicted in FIG. 1, source/drain regions can be formed (e.g., Step S14), followed by ion-implantation and annealing process (e.g., Step S15). A pulse-etching process (e.g., Step S16) can then be performed to etch the formed source/drain regions. In other words, the pulse-etching process is performed after ion implantation/annealing of stress layers for forming source/drain regions.

Figure 5:
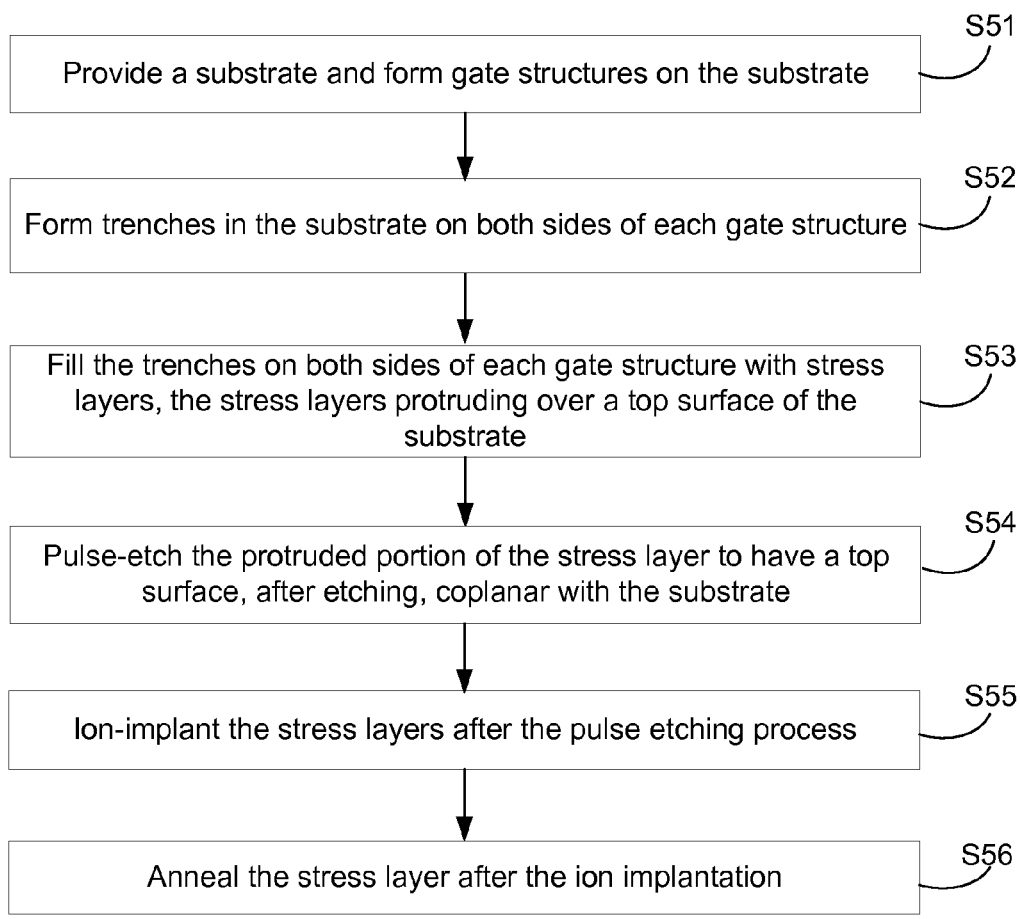
FIG. 5 depicts another exemplary method for forming a semiconductor device in accordance with various disclosed embodiments.

In other embodiments, as depicted in FIG. 5, after stress layers (e.g., Step S53) are formed, a pulse-etching process (e.g., Step S54) can be performed to the stress layer to provide pulse-etched stress layer having a top surface coplanar with the substrate. This can be followed by an ion-implantation (e.g., Step S55) in the pulse-etched stress layer for forming source/drain regions. An annealing process (e.g., Step S56) can then be performed to the stress layers to form source/drain regions. In various embodiments, the method of FIG. 5 can further include any suitable steps and processes as depicted in FIG. 1.

The embodiments disclosed herein are exemplary only. Other applications advantages, alternations, modifications, or equivalents to the disclosed embodiments are obvious to those skilled in the art and are intended to be encompassed within the scope of the present disclosure.

What is claimed is:

1. A method of forming a semiconductor device, comprising:
   providing a substrate;
   forming a plurality of gate structures on a top surface of the substrate to form a plurality of semiconductor devices;
   forming trenches in the substrate on both sides of each gate structure of each semiconductor device;
   filling the trenches on the both sides of each gate structure with stress layers, the stress layers on the substrate protruding over the top surface of the substrate;
   ion-implanting the stress layers on the both sides of each gate structure, wherein the stress layers, formed on the substrate comprising the plurality of gate structures, have different protruded heights over the top surface of the substrate;
   annealing the stress layers after ion-implantation; and
   pulse-etching the stress layers, wherein the pulse-etching is controlled at a pulse frequency such that the stress layers having the different protruded heights are etched with different etching rates and all of the etched stress layers of the plurality of semiconductor devices on the substrate have a top surface coplanar with the top surface of the substrate.

2. The method according to claim 1, wherein:
   the stress layers of the plurality of semiconductor devices on the substrate having the different protruded heights over the top surface of the substrate have different top surface areas of protruded portions.

3. The method according to claim 2, wherein:
   the pulse-etching is controlled such that the stress layers having the different protruded heights and the different top surface areas are etched with the different etching amounts and all of the etched stress layers of the plurality of semiconductor devices on the substrate have the top surface coplanar with the top surface of the substrate.

4. The method according to claim 1, wherein:
   the trenches are formed having a Σ-shape; and
   the stress layers are made of a material including silicon germanium.

5. The method according to claim 1, wherein:
   the trenches are formed having a U-shape; and
   the stress layers are made of a material including silicon carbon.

6. The method according to claim 1, wherein the pulse-etching comprises a plasma etching using an etching gas comprising one of chlorine trifluoride, hydrogen bromide, and chlorine.

7. The method according to claim 6, further comprising:
   plasma etching in a plasma etch chamber at a pressure ranging from about 10 mTorr to about 200 mTorr,
   a power output from an etching machine in a range from about 100 watts to about 2000 watts,
   a bias power in a range from 0 to about 500 watts,
   the pulse frequency of the power output in a range from about 100 Hz to about 10,000 Hz, and
   a duty ratio in a range from about 90% to 0%.

8. The method according to claim 1, wherein the pulse-etching comprises a plasma etching using an gas comprising hydrogen bromide, oxygen, and at least one protective gas.

9. The method according to claim 8, wherein:
   the hydrogen bromide has a flow rate in a range from about 50 sccm to about 1000 sccm,
   the oxygen has a flow rate in a range from about 1 sccm to about 50 sccm, and
   the at least one protective gas comprises a helium gas having a flow rate in the range from about 10 sccm to about 500 sccm and an argon gas having a flow rate in the range from 0 sccm to about 500 sccm.

10. The method according to claim 1, further comprising:
    simultaneously annealing and pulse-etching the stress layers to form a source region and a drain region on the both sides of each gate structure.

11. The method according to claim 1, wherein the stress layers includes a first stress layer having a first protruded height with a first top surface area over the substrate and a second stress layer having a second protruded height with a second top surface area over the substrate, wherein:
    when the first protruded height equals to the second protruded height and the first top surface area is different than the second top surface area, a standby mode of the pulse-etching is controlled to provide sufficient time to dissipate polymer aggregation from an etching surface of protruded portions of stress layers to allow a consistent etching rate of the first and second stress layers, or
    when the first protruded height is not equal to the second protruded height, the pulse-etching is controlled, by adjusting one or more of a pressure, a power output, a bias power, the pulse frequency, and a duty ratio of the pulse-etching, to provide the first and second stress layers with different etch rates such that the pulse-etched stress layers coplanar with the substrate.

12. A method of forming a semiconductor device, comprising:
    providing a substrate;
    forming a plurality of gate structures on a top surface of the substrate to form a plurality of semiconductor devices;
    forming trenches in the substrate on both sides of each gate structure of each semiconductor device;
    filling the trenches on both sides of each gate structure with stress layers, wherein the stress layers, formed on the substrate comprising the plurality of gate structures, have different protruded heights over the top surface of the substrate;
    pulse-etching the stress layers, wherein the pulse-etching is controlled at a pulse frequency such that the stress layers having the different protruded heights are etched with different etching rates and all of the pulse-etched stress layers on the substrate have a top surface coplanar with the top surface of the substrate; and ion-implanting and annealing the pulse-etched stress layers to form a source region and a drain region on the both sides of each gate structure, wherein the source regions and the drain regions of the plurality of semiconductor devices on the substrate have a top surface coplanar with the top surface of the substrate.

13. The method according to claim 12, wherein:
the stress layers of the plurality of semiconductor devices on the substrate having the different protruded heights over the top surface of the substrate have different top surface areas of protruded portions.

14. The method according to claim 13, wherein:
the pulse-etching is controlled such that the stress layers having the different protruded heights and the different top surface areas are etched with the different etching amounts and all of the etched stress layers of the plurality of semiconductor devices on the substrate have the top surface coplanar with the top surface of the substrate.

15. The method according to claim 12, wherein:
the trenches are formed having a Σ-shape; and
the stress layers are made of a material including silicon germanium.

16. The method according to claim 12, wherein:
the trenches are formed having a U-shape; and
the stress layers are made of a material including silicon carbon.

17. The method according to claim 12, wherein the pulse-etching comprises a plasma etching using an etching gas comprising one of chlorine trifluoride, hydrogen bromide, and chlorine.

18. The method according to claim 12, wherein the pulse-etching comprises a plasma etching using an comprising hydrogen bromide, oxygen, and at least one protective gas.

19. The method according to claim 12, wherein the stress layers is formed by an epitaxial growth process.

20. The method according to claim 12, wherein the stress layers includes a first stress layer having a first protruded height with a first top surface area over the substrate and a second stress layer having a second protruded height with a second top surface area over the substrate, wherein:
when the first protruded height equals to the second protruded height and the first top surface area is different than the second top surface area, a standby mode of the pulse-etching is controlled to provide sufficient time to dissipate polymer aggregation from an etching surface of protruded portions of stress layers to allow a consistent etching rate of the first and second stress layers, or
when the first protruded height is not equal to the second protruded height, the pulse-etching is controlled, by adjusting one or more of a pressure, a power output, a bias power, the pulse frequency, and a duty ratio of the pulse-etching, to provide the first and second stress layers with different etch rates such that the pulse-etched stress layers coplanar with the substrate.

* * * * *